United States Patent
Meng et al.

(10) Patent No.: US 9,574,787 B2
(45) Date of Patent: Feb. 21, 2017

(54) PANEL COMPONENT, AIR CONDITIONER AND METHOD FOR MANUFACTURING AIR CONDITIONER

(71) Applicant: Gree Electric Appliances, Inc. of Zhuhai, Guangdong (CN)

(72) Inventors: Zhi Meng, Guangdong (CN); Hui Zhang, Guangdong (CN); Shaolin Chen, Guangdong (CN); Xianlin Wang, Guangdong (CN); Hai Luo, Guangdong (CN); Shuaihui Sun, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 0 days.

(21) Appl. No.: 14/787,333

(22) PCT Filed: Apr. 25, 2014

(86) PCT No.: PCT/CN2014/076220
§ 371 (c)(1),
(2) Date: Feb. 25, 2016

(87) PCT Pub. No.: WO2014/173319
PCT Pub. Date: Oct. 30, 2014

(65) Prior Publication Data
US 2016/0195295 A1    Jul. 7, 2016

(30) Foreign Application Priority Data
Apr. 27, 2013   (CN) .......................... 2013 1 0153727

(51) Int. Cl.
*F24F 11/00* (2006.01)
*F24F 13/20* (2006.01)
(Continued)

(52) U.S. Cl.
CPC ............ *F24F 11/0086* (2013.01); *F24F 13/20* (2013.01); *G02B 27/028* (2013.01); *H05K 1/0274* (2013.01); *F24F 2011/0091* (2013.01)

(58) Field of Classification Search
CPC   F24F 11/0086; F24F 13/20; F24F 2011/0091; G02B 27/028
See application file for complete search history.

(56) References Cited

U.S. PATENT DOCUMENTS

2012/0314348 A1* 12/2012  Moncrieff ............ H05K 5/0017
                                                    361/679.01
2015/0285531 A1* 10/2015  Lee ........................ B65D 25/30
                                                    62/271

(Continued)

FOREIGN PATENT DOCUMENTS

CN          2161509 Y     4/1994
CN          2391266 Y     8/2000
(Continued)

*Primary Examiner* — Daniel Rohrhoff
(74) *Attorney, Agent, or Firm* — Colin P. Cahoon; Shaukat A. Karjeker; Carstens & Cahoon, LLP

(57) ABSTRACT

A panel component (1) comprises a plastic substrate (3), a display (2), and a metal panel (6) covering an outer surface of the plastic substrate (3). The metal panel (6) is fixed on the plastic substrate (3). The display (2) is mounted on the plastic substrate (3) through a display mounting structure. A light-transmitting structure is arranged in the metal panel (6) in a region corresponding to the location of the display (2). The metal panel (6) enables the panel component (1) to have good decorating effect, and the light-transmitting structure ensures clear display. Further disclosed are an air conditioner provided with the panel component (1) and a method for manufacturing the air conditioner.

20 Claims, 4 Drawing Sheets

(51) Int. Cl.
G02B 27/02 (2006.01)
H05K 1/02 (2006.01)

(56) References Cited

U.S. PATENT DOCUMENTS

2016/0061467 A1* 3/2016 Billman ............... F24F 11/0076
                                                          62/56
2016/0117022 A1* 4/2016 Kim ..................... G06F 3/044
                                                         345/174
2016/0252260 A1* 9/2016 Jewell .................... F24F 1/022

FOREIGN PATENT DOCUMENTS

| CN | 1542353 A | 11/2004 |
| CN | 101249916 A | 8/2008 |
| CN | 203215943 U | 9/2013 |
| JP | 2001349601 | 12/2001 |

* cited by examiner

PANEL COMPONENT, AIR CONDITIONER AND METHOD FOR MANUFACTURING AIR CONDITIONER

CROSS REFERENCE TO RELATED APPLICATIONS

This application is a US '371 application of PCT Patent Application No. PCT/CN2014/076220, entitled "PANEL COMPONENT, AIR CONDITIONER, AND METHOD FOR MANUFACTURING AIR CONDITIONER", filed on Apr. 25, 2014, which claims priority to Chinese Patent Application No. 201310153727.9, entitled "PANEL COMPONENT, AIR CONDITIONER, AND METHOD FOR MANUFACTURING AIR CONDITIONER", filed on Apr. 27, 2013, the entire contents of which are incorporated herein by reference.

TECHNICAL FIELD

The present disclosure relates to structure and manufacturing technology of air conditioner, more particularly, to a panel component, an air conditioner and a method for manufacturing an air conditioner.

BACKGROUND

Commonly, an air conditioner, with the aid of an air cooling component, a heating component, or an air purifying component, is an appliance for cooling or heating the room, or purifying the air in the room so as to make the indoor environment more comfortable. This type of air conditioner is provided with a ventilation device, an air cooling and heating device, and an air purifying device. The ventilation device forces the air to circulate indoors, takes in indoor air to exchange heat, or purifies the air and then exhausts the air to the indoors. People have been improving the air conditioners. Especially, as the indoor unit of an air conditioner is installed indoors, the user's expectations for the decorative effect of the indoor unit of an air conditioner in the indoor environment are becoming higher and higher.

The panel component of the air conditioner in the prior art is made of plastic, which lacks metallic texture. As for high-grade air conditioners, part or whole of the panel component is made of metal in order to highlight the texture, which creates impressions of high quality. However, it is inconvenient for mounting a display because of limitations on processing an all-metal panel, moreover, metal material is opaque and cannot perform clear display.

SUMMARY OF THE INVENTION

In order to solve a first technical problem, the present disclosure provides a panel component, the panel component is made of metal, and the display area of the panel component is light-transmitting and is capable of performing clear display.

In order to solve a second technical problem, the present disclosure provides an air conditioner, the air conditioner adopts the panel component above, which creates impressions of high quality, and the display area of which is light-transmitting and capable of performing clear display.

In order to solve a third technical problem, the present disclosure provides a method for manufacturing an air conditioner, the method is convenient for processing, and is capable of manufacturing an air conditioner with metallic texture, which creates impressions of high quality and is capable of performing clear display.

The objectives of the present disclosure is achieved by the following technical schemes:

A panel component comprises a plastic substrate, a display and a metal panel covering an outer surface of the plastic substrate; the metal panel is fixed on the plastic substrate; the plastic substrate is provided with a display mounting structure, and a panel mounting structure for mounting the panel component; the display is mounted on the plastic substrate through the display mounting structure; a light-transmitting structure is arranged in the metal panel in a region corresponding to a location of the display.

Further, the light-transmitting structure is embodied as display holes; the display holes are arranged in the metal panel in the region corresponding to the location of the display.

Further, the display holes are filled with light-transmitting material.

An air conditioner comprises a case, and further comprises the panel component above; the panel component is mounted on the case through the panel mounting structure of the panel component.

A method for manufacturing the air conditioner above comprises following steps:

step 1: making a light-transmitting structure in the metal panel in the region corresponding to the location of the display;

step 2: fixing the metal panel on the plastic substrate;

step 3: mounting the display on the plastic substrate through the display mounting structure;

step 4: mounting the panel component on the case through the panel mounting structure.

The beneficial effects of the present disclosure are as follows:

The panel component of the present disclosure comprises the plastic substrate, the display, and the metal panel covering the outer surface of the plastic substrate. The metal panel is fixed on the plastic substrate. The display is mounted on the plastic substrate through the display mounting structure. The light-transmitting structure is arranged in the metal panel in the region corresponding to the location of the display. Therefore, the metal panel enables the panel component to have good decorating effect, and the light-transmitting structure ensures clear display.

As the air conditioner of the present disclosure comprises the panel component, the indoor unit of the air conditioner has an enhanced aesthetic appearance, and flexible and variable styles.

The method for manufacturing the air conditioner of the present disclosure adopts brand-new processing technology, which ensures that the air conditioner produced has the following effects:

1) having a higher-grade panel component with metallic texture;
2) meeting requirements for assembling panel components, without limitations relating to metal processing technique;
3) realizing the display for graphs on a metal panel, and making up for the non-light-transmitting defect of metal components.

Further, the light-transmitting structure is embodied as display holes arranged in the metal panel in the region corresponding to the location of the display, and the display holes are filled with light-transmitting material, as a result, the dust is prevented from entering the display holes, which avoids affecting the display effect and ensures the electric safety of the display.

The elements are denoted as follows:
1. panel component; 2. display; 3. plastic substrate; 41. screw stud; 42. snap-fit fastener; 51. shaft; 52. panel component snap; 6. metal panel; 7. display hole; 8. transparent glue.

DETAILED DESCRIPTION OF THE PREFERRED EMBODIMENTS

Figure 1:
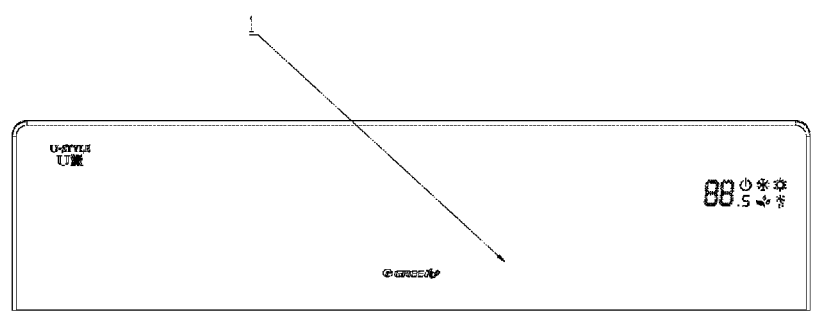
FIG. 1 is a front structural schematic view of the panel component according to one embodiment of the present disclosure.
Figure 2:
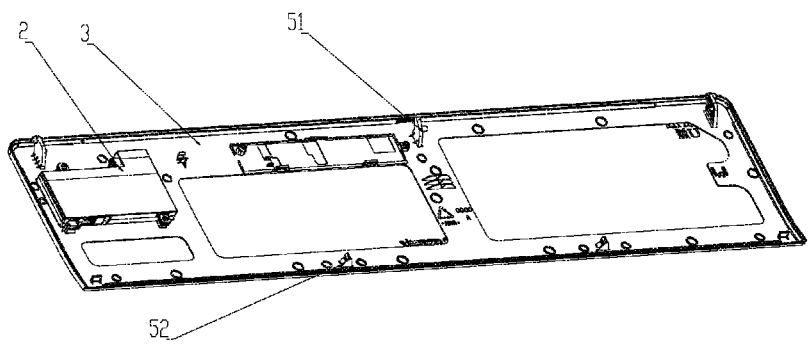
FIG. 2 is a schematic view of the internal structure of the panel component shown in FIG. 1.
Figure 3:
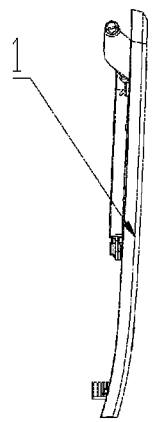
FIG. 3 is a side structural schematic view of the panel component shown in FIG. 1.
Figure 4:
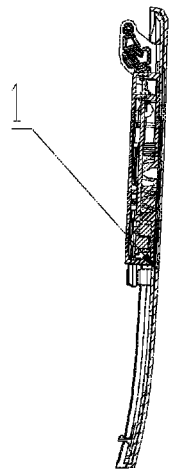
FIG. 4 is a schematic view of the sectional structure of the panel component shown in FIG. 3.
Figure 5:
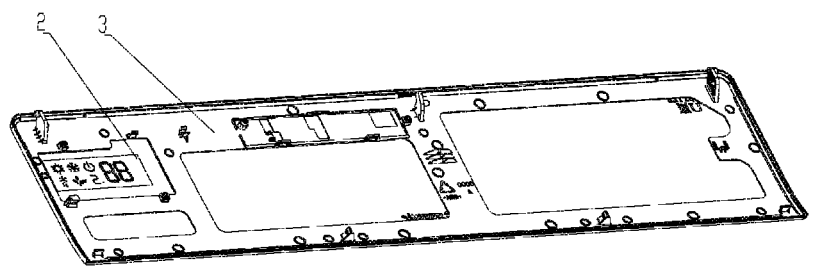
FIG. 5 is a stereo structural schematic view of the panel component shown in FIG. 1.
Figure 6:
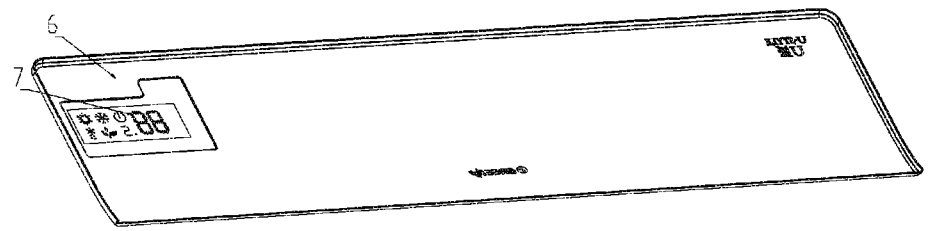
FIG. 6 is a structural schematic view of the metal panel of the panel component shown in FIG. 1.

In order to solve the problems existing in the air conditioner of the prior art, as shown in FIGS. 1-6, the present disclosure provides a panel component 1, which comprises a plastic substrate 3, a display 2, and a metal panel 6 covering the outer surface of the plastic substrate 3. The metal panel 6 is fixed on the plastic substrate 3. The plastic substrate 3 is provided with a display mounting structure, and a panel mounting structure for mounting the panel component. The display 2 is mounted on the plastic substrate through the display mounting structure. A light-transmitting structure is arranged in the metal panel 6 in a region corresponding to the location of the display 2.

The light-transmitting structure is embodied as display holes 7 arranged in the metal panel 6 in a region corresponding to the location of the display 2.

Preferably, the display holes 7 are filled with light-transmitting material.

The air conditioner includes a case, and further includes the panel component 1. The panel component 1 is mounted on the case through the panel mounting structure.

The method for manufacturing the air conditioner includes following steps:

Step 1: making a light-transmitting structure in the metal panel in the region corresponding to the location of the display;

Step 2: fixing the metal panel on the plastic substrate;

Step 3: mounting the display on the plastic substrate through the display mounting structure;

Step 4: mounting the panel component on the case through the panel mounting structure.

Embodiments

Figure 8:
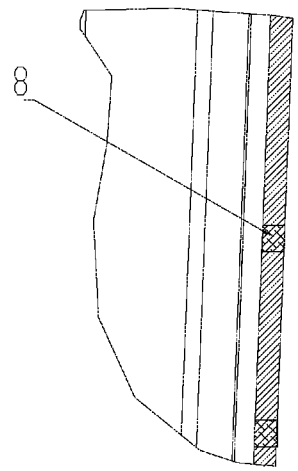
FIG. 8 is a magnified structural schematic view of the display holes on the metal panel shown in FIG. 6.

In the embodiments, as shown in FIG. 1, FIG. 4, FIG. 6 and FIG. 8, the light-transmitting structure is embodied as display holes 7. The display holes 7 are arranged in the metal panel 6 in the region corresponding to the location of the display.

The light-transmitting material is transparent glue 8, which is filled in the display holes and then seals the display holes.

The diameter of each of the display holes 7 is ranged from 0.3 mm to 2 mm.

Preferably, the display holes 7 are arranged according to the graph to be displayed. For example, the display holes 7 may be arranged to present the shape of "88", a snowflake, a sun or a power switch symbol.

Figure 7:
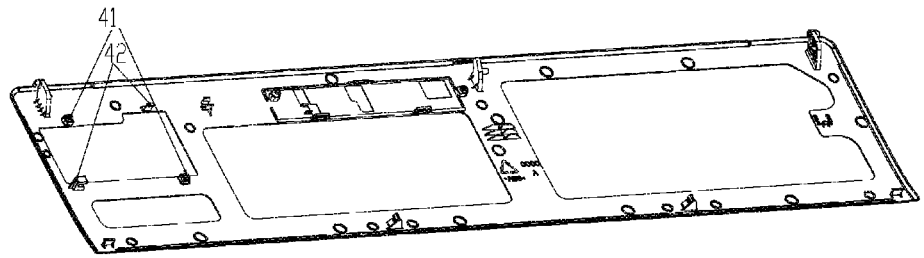
FIG. 7 is a structural schematic view of the plastic substrate of the panel component shown in FIG. 1.

As shown in FIG. 2, FIG. 5, FIG. 6 and FIG. 7, the plastic substrate 3 is connected to the metal panel 6 through adhesives or screws.

The panel mounting structure includes at least one shaft 51 and at least one panel component snap 52, which are disposed on the back of the plastic substrate 3.

The display 2 is mounted on the back of the plastic substrate 3; and the display surface faces the metal panel 6.

The display mounting structure includes at least one screw stud 41 and at least one snap-fit fastener 42, which are disposed on the back of the plastic substrate 3. The snap-fit fastener 42 securely fastens the outer edge of the display 2.

The case is provided with a shaft hole and a clamping groove for connecting the panel component 1. The shaft 51 of the panel component 1 is inserted in the shaft hole of the case, enabling the panel component and the case to be jointed together and rotatable relative to each other. The panel component snap 52 is clamped and fixed in the clamping groove disposed in the case for connecting the panel component 1.

The method for manufacturing the air conditioner is specified as follows:

the process of making a light-transmitting structure in step 1 is implemented by dripping transparent glue into the display holes of the metal panel;

the process of fixing the metal panel on the plastic substrate in step 2 is implemented by connecting the plastic substrate to the metal panel through adhesives or screws;

the process of mounting the panel component on the case in step 4 is implemented by inserting the shaft of the panel component into the shaft hole of the case, enabling the panel component and the case to be jointed together and rotatable relative to each other; clamping and fixing the panel component snap into the clamping groove of the case.

After the panel component is fixed on the case, the display can be remotely controlled by a controller of the air conditioner. When the indicator light is turned on, the graph is displayed on the metal panel through the transparent glue. Meanwhile, the transparent glue prevents dust from getting into the holes and blocking the holes, further avoids affecting the display of the graph and avoids affecting the operation of the whole refrigeration system.

What described above are several embodiments of the present invention, and they are specific and in details, but not intended to limit the scope of the present invention. It will be understood by those skilled in the prior art that various modifications and improvements can be made without departing from the spirit and the scope of the present invention. Therefore, the scope of the present invention is defined by the appending claims.

What is claimed is:
1. A panel component, comprising a plastic substrate, a display and a metal panel covering an outer surface of the plastic substrate; wherein, the metal panel is fixed on the plastic substrate; the plastic substrate is provided with a display mounting structure, and a panel mounting structure for mounting the panel component; the display is mounted on the plastic substrate through the display mounting structure; a light-transmitting structure is arranged in the metal panel in a region corresponding to a location of the display.

2. The panel component according to claim 1, wherein, the light-transmitting structure is embodied as display holes; the display holes are arranged in the metal panel in the region corresponding to the location of the display.

3. The panel component according to claim 2, wherein, the display holes are filled with light-transmitting material.

4. The panel component according to claim 3, wherein, the light-transmitting material is transparent glue, which is filled in the display holes and seals the display holes.

5. The panel component according to claim 2, wherein, each of the display holes has a diameter ranged from 0.3 mm to 2 mm.

6. The panel component according to claim 5, wherein, according to a graph to be displayed, the display holes are arranged to present a shape selected from the group consisting of "88", a snowflake, a sun or a power switch symbol.

7. The panel component according to claim 5, wherein, the plastic substrate is connected to the metal panel through adhesives or screws.

8. The panel component according to claim 7, wherein, the panel mounting structure comprises at least one shaft and at least one panel component snap, which are disposed on a back of the plastic substrate.

9. The panel component according to claim 5, wherein, the display is mounted on a back of the plastic substrate; and a display surface of the display faces the metal panel.

10. The panel component according to claim 9, wherein, the display mounting structure comprises at least one screw stud and at least one snap-fit fastener, which are mounted on a back of the plastic substrate; the snap-fit fastener securely fastens an outer edge of the display.

11. An air conditioner, comprising a case, wherein, the air conditioner further comprises the panel component according to claim 1; the panel component is mounted on the case through the panel mounting structure of the panel component.

12. The air conditioner according to claim 11, wherein, the case is provided with a shaft hole and a clamping groove for connecting the panel component; the panel mounting structure comprises at least one shaft and at least one panel component snap, which are disposed on a back of the plastic substrate; the shaft of the panel component is inserted in the shaft hole of the case, enabling the panel component and the case to be jointed together and rotatable relative to each other; the panel component snap is clamped and fixed in the clamping groove disposed in the case for connecting the panel component.

13. A method for manufacturing the air conditioner of claim 11, comprising the following steps:
    step 1: making a light-transmitting structure in the metal panel in the region corresponding to the location of the display;
    step 2: fixing the metal panel on the plastic substrate;
    step 3: mounting the display on the plastic substrate through the display mounting structure;
    step 4: mounting the panel component on the case through the panel mounting structure.

14. The method according to claim 13, wherein, the light-transmitting structure is embodied as display holes; the display holes are arranged in the metal panel in the region corresponding to the location of the display; said making a light-transmitting structure in step 1 is implemented by dripping transparent glue into the display holes of the metal panel.

15. The method according to claim 13, wherein, said fixing the metal panel on the plastic substrate in step 2 is implemented by connecting the plastic substrate to the metal panel with glue or screws.

16. The method according to claim 13, wherein, the panel mounting structure comprises at least one shaft and at least one panel component snap, which are disposed on a back of the plastic substrate; said mounting the panel component on the case in step 4 is implemented by inserting a shaft of the panel component into a shaft hole of the case, enabling the panel component and the case to be jointed together and rotatable relative to each other; clamping and fixing the panel component snap of the panel mounting structure into a clamping groove of the case.

17. The method according to claim 13, wherein, the case is provided with a shaft hole and a clamping groove for connecting the panel component; the panel mounting structure comprises at least one shaft and at least one panel component snap, which are disposed on a back of the plastic substrate; the shaft of the panel component is inserted in the shaft hole of the case, enabling the panel component and the case to be jointed together and rotatable relative to each other; the panel component snap is clamped and fixed in the clamping groove disposed in the case for connecting the panel component.

18. The air conditioner according to claim 11, wherein, the light-transmitting structure is embodied as display holes; the display holes are arranged in the metal panel in the region corresponding to the location of the display.

19. The air conditioner according to claim 18, wherein, the display holes are filled with light-transmitting material.

20. The air conditioner according to claim 19, wherein, the light-transmitting material is transparent glue, which is filled in the display holes and seals the display holes.

* * * * *